US011310581B1

(12) United States Patent
Shanmugam et al.

(10) Patent No.: US 11,310,581 B1
(45) Date of Patent: Apr. 19, 2022

(54) ANTENNA ARCHITECTURE AND DESIGN FOR MINIATURIZED EAR-WORN DEVICES

(71) Applicant: Amazon Technologies, Inc., Seattle, WA (US)

(72) Inventors: Balamurugan Shanmugam, Fremont, CA (US); Tzung-I Lee, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 203 days.

(21) Appl. No.: 16/819,929

(22) Filed: Mar. 16, 2020

(51) Int. Cl.
*H04R 25/00* (2006.01)
*H01Q 1/36* (2006.01)
*H04R 1/10* (2006.01)
*H01Q 5/378* (2015.01)
*H05K 1/18* (2006.01)
*H04R 1/04* (2006.01)

(52) U.S. Cl.
CPC .......... *H04R 1/1016* (2013.01); *H01Q 5/378* (2015.01); *H04R 1/04* (2013.01); *H04R 1/1041* (2013.01); *H05K 1/181* (2013.01); *H05K 2201/10083* (2013.01)

(58) Field of Classification Search
CPC ........ H01Q 1/243; H01Q 1/245; H01Q 1/273; H01Q 1/48; H01Q 1/52; H01Q 19/10; H01Q 1/36; H01Q 9/42; H04R 25/554; H04R 2225/51
See application file for complete search history.

(56) References Cited

U.S. PATENT DOCUMENTS 9,293,814 B2 * 3/2016 Ozden ..................... H01Q 1/36

* cited by examiner

*Primary Examiner* — Amir H Etesam
(74) *Attorney, Agent, or Firm* — Lowenstein Sandler LLP

(57) ABSTRACT

Technologies directed to reducing wireless earbud form factor and cost without compromising antenna performance are described. One wireless earbud includes a metal element that is a hybrid radiating element, touch element, and electrostatic discharge (ESD) trap. The metal element can include a first section coupled to a first ESD element, a second section that can include a circular element, and a third section coupled to a second ESD element. The wireless earbud can include touch circuitry coupled to the metal element to detect a presence of a conductive object in proximity to the metal element. The wireless earbud can include a radio that is parasitically coupled to the metal element and configured to apply a radio frequency signal to parasitically induce a current on the metal element that causes the metal element to radiate electromagnetic energy as a parasitic monopole element.

20 Claims, 11 Drawing Sheets

| FCC Requirement: 1.6 mW/g ⌒601 | BT Input Power to attain SAR of 1.6 mW/g ⌒603 | In-Ear Total Radiated Power (TRP) w/SAR at 1.6 mW/g ⌒605 | In-Ear Effective Isotropic Radiated Power (EIRP) with SAR at 1.6 mW/g ⌒607 |
|---|---|---|---|
| Conventional Antenna Design ⌒611 | 18 dBm | +6.3 dBm | 13.2 dBm |
| Proposed Antenna Design ⌒613 | 19.4 dBm | +7.6 dBm | 14.7 dBm |

FIG. 6

ANTENNA ARCHITECTURE AND DESIGN FOR MINIATURIZED EAR-WORN DEVICES

BACKGROUND

A large and growing population of users enjoys music and other audio content using wireless listening devices. For example, ear-worn or in-ear wireless earphones provide users with flexibility and convenience in listening to audio content, without having to physically connect a wire to an audio source (e.g., a mobile device, a television, etc.). In-ear wireless earphones provide for touch-based user interaction to control functionality of the earphones (e.g., playback functionality, volume control, etc.) In order to maximize user comfort, the in-ear earphones, the form factor of the device is limited in size, resulting in the various components of the device being in close proximity to one another.

BRIEF DESCRIPTION OF DRAWINGS

The present inventions will be understood more fully from the detailed description given below and from the accompanying drawings of various embodiments of the present invention, which, however, should not be taken to limit the present invention to the specific embodiments, but are for explanation and understanding only.

FIG. 6 is a table of a comparison of a wireless earbud with a hybrid metal element and a wireless earbud with discrete antenna and touch elements according to one embodiment.

DETAILED DESCRIPTION

Figure 1A:
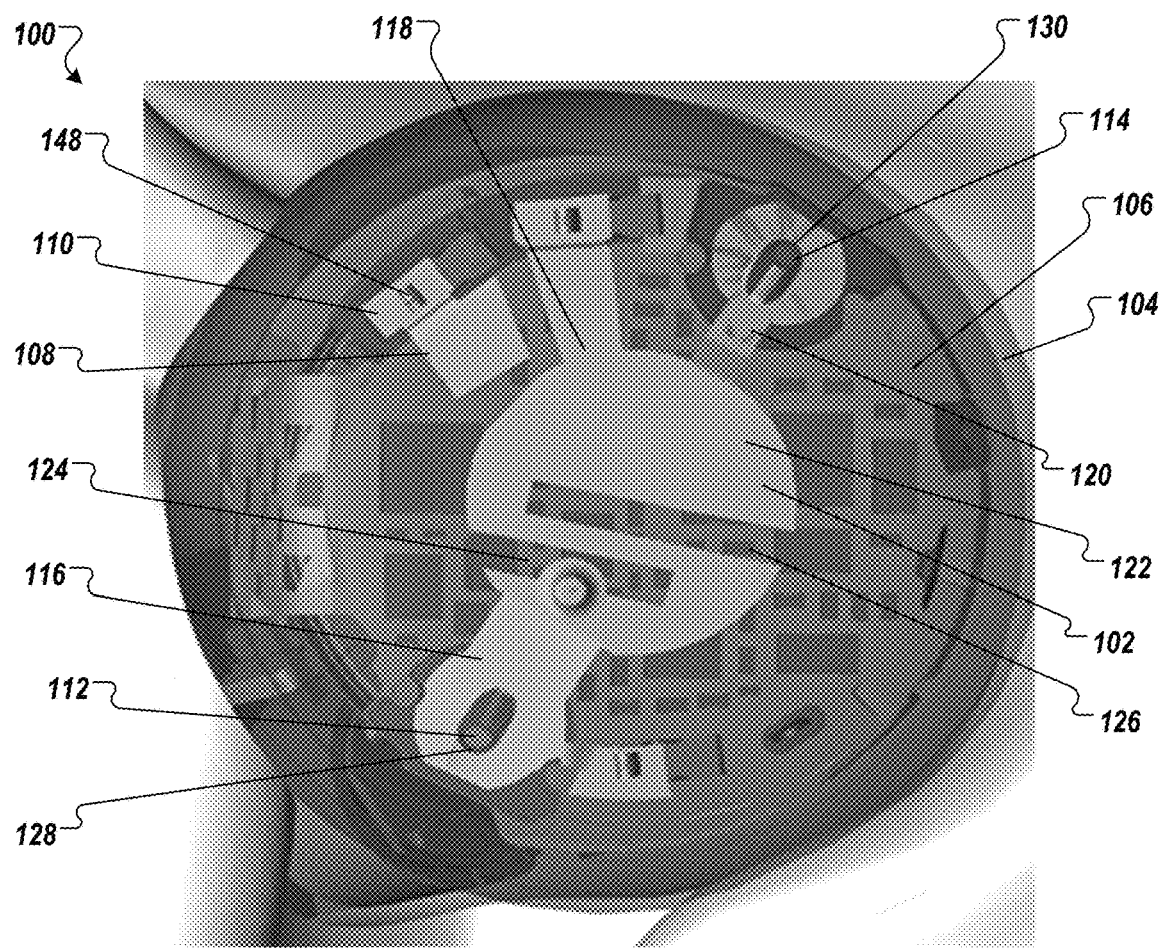
FIG. 1A is a diagram of an antenna architecture of a wireless earbud with a metal element combining a radiating element, a touch element, and electrostatic discharge (ESD) traps according to one embodiment.

Technologies directed to decreasing form factors of wireless transceivers with touch capability without compromising antenna performance are described. The Bluetooth® wireless technology has been widely adopted across the consumer industry in many consumer products, including smart phones, smart wearable devices, wireless speakers, wireless earbuds, etc. In-ear wireless electronic devices (referred to herein as "earbuds," "wireless earbuds," or "ear-worn devices") are traditionally size limited for user comfort. Accordingly, conventional wireless earbuds are sized to fit comfortably within a user's ear, while enclosing various components to enable operation of the earbuds, including, for example, one or more touch sensing controls. In addition, users are demanding products with increasingly smaller form factor. Due to the wireless nature of these wireless earbuds, the wireless earbud includes an antenna system to wirelessly receive a radio transmission from an audio source and transmit signals to the audio source. The size limitation in conventional ear-worn devices results in constraints on the physical volume and positioning of the antenna system within the wireless earbud. Further, wireless earbuds require a means to control the earbuds (e.g., a touch sensing controller to enable a user to control operations of the earbud, such as playback, volume, power, and the like). To cater to the natural behavior of the user to touch the device in the center, it is desirable to have a touch sensor in a central part of the earbud. The demand for dedicated user-interactive features (such as touch-enabled features) uses significant real estate within the wireless earbud. In addition, wireless earbuds typically have microphones (e.g., for voice control, to speak on the phone, etc.) or other components that are sensitive to ESD. The need to provide ESD protection (e.g., via ESD traps, ESD capture points, ESD diodes, or the like) to protect the microphones from ESD strikes restricts the available area within the wireless earbud, and creates challenges for antenna placement and design. Some wireless earbuds include components that are placed outside (e.g., on a cosmetic surface) of the earbud to improve the available real estate for antenna placement and design, however, this creates the need for additional manufacturing steps (e.g., such as polishing and painting) to mask the antenna pattern on the cosmetic surface (e.g., to match the color requirement (e.g., the wireless earbud may be black, white, or the like)) of the wireless earbud. In some implementations, wireless earbuds incorporate a first metal element for an antenna (such as a Bluetooth antenna) and a second metal element for touch sensing and ESD protection. This can result in a larger form factor for the wireless device as well as an increased manufacturing cost due to the placement of the metal for the touch sensing on the outside surface (e.g., on a cosmetic surface) of the housing.

Aspects of the present disclosure overcome the deficiencies of conventional wireless earbuds by combining the antenna (e.g., radiating element), touch element, and ESD traps (e.g., sections of a metal element coupled to ESD elements as a single integrated physical entity (e.g., the metal element). This allows for a smaller form factor and a lower bill of material (BoM) cost without compromising on antenna, touch, and ESD performance. Additionally, combining the radiating element, touch element, and ESD traps together provides high efficiency antenna performance, zero dead-zone for touch sensing on the earbud, and ESD protection to components such as microphones within the wireless earbuds. In one embodiment, the ESD element is an ESD diode. In other embodiments, the ESD element can be ESD capacitors, ESD capture points, or the like. The wireless earbud form factor may be smaller by approximately 25% and the BoM cost to manufacture a pair of wireless earbuds may be decreased. Aspects of the present disclosure provide an antenna, touch element, and ESD protection design printed on an inner surface of the top of the housing of the earbud which simplifies the manufacturing product. Simpler laser direct structuring (LDS) manufacturing process eliminates the need for cosmetic painting layers by switching the LDS to the surface of the inner housing (a non-cosmetic surface). Aspects of the present disclosure overcome conflicting signal and ground requirements of the antenna, touch element, and ESD elements by providing efficient radio frequency (RF) and direct current (DC) decoupling on antenna and touch lines.

Aspects of the present disclosure provide a wireless earbud device with a metal element that is a hybrid radiating element, touch element, and ESD traps. Note that though described as a wireless earbud device, aspects of the present disclosure are not limited to a wireless earbud device. Aspects of the present disclosure can provide a wireless device or electronic device that includes a metal element that is a hybrid radiating element, touch element, and ESD traps.

FIG. 1A is a diagram of an antenna architecture of a wireless earbud 100 with a metal element 102 operating as a radiating element, a touch element, and ESD traps according to one embodiment. The wireless earbud 100 may also be referred to as the earbud 100 herein. The wireless earbud 100 is configured to wirelessly receive a radio signal from an audio source for processing and playback by one or more speaker components of the wireless earbud 100. The wireless earbud 100 includes a housing 104 and a circuit board 106 that is disposed within the housing 104. The antenna architecture of the wireless earbud 100 is printed or disposed on a non-cosmetic surface (e.g., the top inside surface of the housing 104) of the wireless earbud 100. This decreases the cost of the wireless earbud device by shifting the design to the non-cosmetic surface of the housing 104, thereby eliminating the need for secondary manufacturing processes. At least some portion of the metal element 102 serves effectively as a zero-footprint antenna. A zero-footprint antenna means there is no dedicated ground clearance on the circuit board 106 dedicated to the antenna. This enables a highly miniaturized product. The wireless earbud 100 further includes touch circuitry coupled to the metal element 102 at a first node (not shown in FIG. 1A), a radio (not shown in FIG. 1A), and an antenna feed structure 110 (e.g., a radio frequency (RF) feed structure). The first node can be a connection point where the touch circuitry is coupled to the metal element 102. The radio may be located in proximity of the first node. The wireless earbud 100 includes an audio output device, such as an audio speaker, to produce/playback audio such as voice calls, media, etc.

The radio is disposed on the circuit board 106 and is further coupled to the antenna feed structure 110 at an RF feed point. The antenna feed structure 110 is a driven element that is coupled to the metal element 102. A current flow on the antenna feed structure 110 parasitically induces current on the metal element and causes the metal element to radiate electromagnetic energy. The radio 108 is parasitically coupled to the metal element 102 and is configured to cause the metal element 102 (or at least a portion of the metal element 102) to radiate as a parasitic monopole element. In some embodiments, the metal element 10 is a parasitically coupled monopole antenna. In other embodiments, the metal element 102 is one of a loop antenna, an inverted-S antenna, a slot antenna, a patch antenna, or the like. A decoupling circuit (not shown in FIG. 1A) is coupled between the radio 108 and the antenna feed structure 110 in order to apply an RF signal to the antenna feed structure 110 via the decoupling circuit. The antenna feed structure 110 is configured to parasitically induce a current on the metal element 102 that causes the metal element 102 (or at least a portion of the metal element 102) to radiate electromagnetic energy. In some embodiments, the current is a surface current on the surface of the metal element. In some embodiments, the metal element 102 is configured to radiate electromagnetic energy with an efficiency between −12 decibels (dB) and −14 dB within an operating frequency range of the radio 108. In one embodiment, the operating frequency is the 2.4 GHz frequency band for personal area network (PAN) applications (e.g., Bluetooth® technology) or for wireless local area network (WLAN) applications (e.g., Wi-Fi® technology). In some embodiments, the metal element 102 is configured to radiate electromagnetic energy with an efficiency between −12 dB and −19 dB within an operating frequency range of the radio 108. In one embodiment, the operating frequency is a wide area network (WAN) frequency band (e.g. Long Term Evolution (LTE) technology).

The touch circuitry is operatively coupled to the metal element 102 at the first node and is configured to detect a presence of a conductive object in proximity to the metal element 102. The touch circuitry may include a single capacitive sensor electrode or multiple capacitive sensor elements arranged in multiple dimensions for detecting a proximity of a conductive element to the metal element 102. An electrical signal representative of the capacitance detected by each capacitive sensor may be processed by a processing device, which in turn produces electrical or optical signals representative of the proximity of the conductive element in relation to the metal element 102. The conductive element may be a finger, a stylus, or the like.

The metal element 102 includes at least a first section 116, a second section 118, and a third section 120. In one embodiment, the second section 118 includes a circular element 122. The circular element 122 may be a hybrid element, such as an electrode for touch and a radiating element for radio communication. In one embodiment, the circular element 122 includes a section that is located between a first slit 124 in the circular element 122 and a second slit 126 in the circular element 122. The first slit 124 and the second slit 126 are cutouts in the metal element. The first slit 124 and the second slit 126 may be parallel to each other. In one embodiment, the first slit 124 extends inward from a perimeter of the circular element 122 in a first direction and the second slit 126 extends inward from the perimeter of the circular element 122 in a section direction opposite to the first direction. In one embodiment, the slits 124 and 126 in the circular element 122 create a meandering conductive path within the metal element 102. In one embodiment, the circular element includes a first slit and a second slit that create a meandering conductive path between a distal end of the parasitic monopole element and a proximal end of the parasitic monopole element, the proximal end being closer to the node. In one embodiment, the meandering conductive path within the metal element 102 is to create an effective length of the metal element 102. In one embodiment, the effective length may be a tuning length of a radiating portion of the metal element 102. The effective length of the metal element may be designed to correspond to an operating frequency range of the radio 108. In one embodiment, the meandering conductive path creates an effective length of the parasitic monopole element for the desired frequency (e.g., 2.4 GHz for Bluetooth). In some embodiments, a width of the first slit 124 and a width of the second slit 126 may be approximately 0.5 mm. In some embodiments, a distance between the first slit 124 and the second slit 126 may be approximately between 0.35 mm and 0.65 mm.

In the depicted embodiment, the wireless earbud 100 includes a first microphone 112, and a second microphone 114. The first section 116 is disposed in proximity to the first microphone 112 and includes a first opening 128 located above the first microphone 112. The third section 120 is disposed in proximity to the second microphone 114 and includes a second opening 130 located above the second microphone 114. In one embodiment, the first section 116 operates as a first ESD trap and the third section 120 operates as a second ESD trap to protect the first microphone and the second microphone, respectively. In other embodiments, the first section 116 and a portion of the circular element act as a first ESD trap while the third section 120 and a portion of the circular element act as a second ESD trap. A first ESD element (not shown in FIG. 1A) is coupled to the first section 116 and to a ground plane of the circuit board 106. In one embodiment, the first ESD element is an ESD diode. In other embodiments, the first ESD element is an ESD capacitor, an ESD device, ESD circuitry, or the like. The ground plane may be a layer or surface of the circuit board 106, a metal frame of the wireless earbud 100, or the like. In one embodiment, the first ESD element provides an electrical path from the metal element 102 to the ground plane for an ESD event at the metal element 102 to protect the first microphone from the ESD event. A second ESD element (not shown in FIG. 1A) is coupled to the third section 120 and to the ground plane of the circuit board 106. The second ESD element provides an electrical path from the metal element 102 to a ground for an ESD event at the metal element 102 to protect second microphone 114 from the ESD event. The ESD elements may be ESD devices, ESD diodes, or the like. The first microphone 112 and the second microphone 114 are disposed on opposite ends of the circuit board along a diameter of the circular touch element.

The first section 116 and the third section 120 are sections of the metal element that operate as ESD traps that can effectively trap ESD spikes (such as sparks, strikes, surges, or other ESD events that cause a sudden increase of current) and direct the excess current to a ground potential via the ESD elements. The ESD elements may be diodes or other circuitry elements that provides a shortest path to ground during an ESD event. An ESD event may result from an electrical short, a build-up of static electricity, contact from a charged object such as a finger of a user or the like.

In some embodiments, the first opening 128, the second opening 130, and a center point of the circular element 122 are located on a same axis, the center point being located between the first opening 128 and the second opening 130. In some embodiments, the center point of the circular element 122 is at a center point of the housing 104. The center point being centered on the housing 104 can cater to the natural behavior of the user to touch the device in the center and can provide improved RF performance. Alternatively, the circular element 122 can be offset from the center point of the housing 104. In some embodiments a center point of the first section 116, a center point of the circular element 122, and a center point of the third section 120 are located on a same axis. In some embodiments, the first opening 128 and the second opening 130 form a line which overlaps or approximately overlaps a source of audio (such as a user's mouth). In some embodiments, the orientation of first opening 128, the second opening 130, and the center point of the circular element are configured in order to perform noise cancellation.

In the embodiment depicted in FIG. 1A, the wireless earbud 100 has two microphones, two sections of the metal element corresponding to the two microphones, and two ESD elements corresponding to the two microphones and the two sections. It should be noted however, that the wireless earbud may include one microphone and one corresponding section and corresponding ESD element, or the electronic device may include three (or four, or more) microphones and three (or four, or more) corresponding sections and corresponding ESD elements. Further, the electronic device can include sections and ESD elements corresponding to any ESD-sensitive device or electrical component in addition to microphones. In general, the electronic device can include an integer number, N, of ESD-sensitive devices with N corresponding sections and N corresponding ESD elements.

Figure 1B:
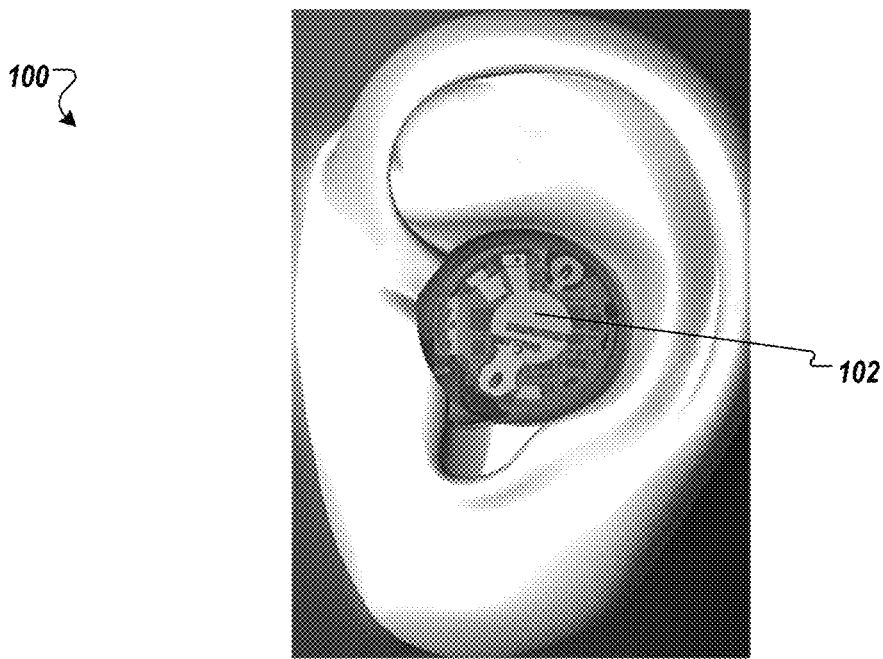
FIG. 1B is a diagram of an antenna architecture of a wireless earbud with a metal element operating as a radiating element, touch element, and ESD traps worn in a user's ear according to one embodiment.

FIG. 1B is a diagram of an antenna architecture of a wireless earbud 100 with a metal element 102 operating as a radiating element, touch element, and ESD traps worn in a user's ear according to one embodiment. The hybrid structure of the metal element 102, including the radiating element, touch element, and ESD traps, all provide for a zero-footprint antenna for which there is no dedicated ground clearance on the circuit board. This can enable a highly miniaturized product for user comfort. By leveraging the touch element at the center of the device as an electromagnetic energy radiator, the wireless earbud 100 is enabled for touch and/or gesture control while the antenna performance is not compromised. The touch element is configured to operate as an electromagnetic radiator by introducing slits to create a meandering touch pattern for antenna resonance. The wireless earbud 100 with the hybrid metal element design of the metal element 102 allows for a smaller device compared to a wireless earbud that does not include a hybrid metal element, which may be approximately 25% larger.

In some embodiments, the metal element is contained within a housing of the earbud. The wireless earbud includes a circuit board, such as a printed circuit board (PCB), within the housing. The wireless earbud device includes a first microphone and a second microphone, both disposed on the circuit board. The first microphone and the second microphone are oriented to form an imaginary straight line above the plane of the circuit board. The imaginary straight line overlaps both microphones, the center of the earbud, and a source of input noise such as the mouth of a user wearing the wireless earbud. The wireless earbud device includes touch circuitry operatively coupled to the metal element at a first node and a radio parasitically coupled to the metal element. The touch circuitry is configured to detect a presence of a conductive object in proximity to the metal element. The conductive object can be a user's finger when the user would like to control the wireless earbud to turn on or turn off the earbud, to adjust volume, to set playback, and the like. The radio is configured to cause the metal element to radiate electromagnetic (EM) energy as a parasitic monopole element. The metal element has physical attributes and is placed so as to protect circuitry from ESD events.

In some embodiments, the metal element can include at least a first section, a second section, and a third section. In one embodiment, the third section can include with a circular element. In other embodiments, the third section can include an element of a different shape, such as elliptical, square, some arbitrary shape, or the like. The circular element may be a hybrid element, such as an electrode for touch and a radiating element for radio communication. In one embodiment, the first section can be located in proximity of the first microphone and can have an opening (or hole or cutout) above the first microphone, so as to not impede the ability of the first microphone to record or receive audio. The second section can be located in proximity of the second microphone and can have an opening (or hole or cutout) above the second microphone, so as to not impede the ability of the second microphone to record or receive audio. In other embodiments, the wireless earbud may have one, three, four, or more microphones, and corresponding sections. A first ESD device (e.g., an ESD element, an ESD diode, or the like) is coupled to the first section to provide an electrical path from the metal element to ground (e.g., such as a ground plane of the circuit board, or some other ground) to protect the first microphone during an ESD event at the metal element. A second ESD device is coupled to the second section to provide an electrical path from the metal element to ground (e.g., such as a ground plane of the circuit board, or some other ground) to protect the second microphone during an ESD event at the metal element. As such, the metal element operates as an ESD trap in connection with touch operations and radio operations. The wireless earbud device includes an audio speaker component disposed on the circuit board in order to produce or play an audio output (e.g., audio playback, music, phone calls, notifications, etc.).

In some embodiments, the circular element is roughly the size of a finger, or slightly smaller (e.g., approximately 7 mm). In one embodiment, the circular element can include a section within the circular element that extends from a first side of the circular element between a first slit in the circular element and a second slit in the circular element. The second slit is parallel to the first slit. In another embodiment, the first slit can extend inward from a perimeter of the circular element in a first direction and the second slit can extend inward from the perimeter of the circular element in a second direction opposite the first direction. The first slit and the second slit are to create a meandering conductive path between a distal end of the circular element and a proximal end of the circular element. The proximal end is the end of the circular element that is closer to the first node coupled to the metal element and the touch circuitry. In another embodiment, the circular element includes a meandering conductive path within the circular element.

The radiation, touch, and ESD subsystems have conflicting signal and ground requirements. A signal generated by the touch circuitry in response to a conductive object in proximity to the touch element may be saturated with the presence of a direct current (DC) ground. The ESD design requires the shortest path to ground in case of an ESD event. Further the antenna has RF ground requirements for proper impedance matching which requires efficient radio frequency/direct current (RF/DC) filtering circuitries and battery tab choking for RF (which will be described in further detail in reference to FIG. 2 and FIGS. 3A-3D) to achieve a similar in-ear antenna performance compared to a wireless earbud that includes discrete antenna and touch elements. The microphones are protected from ESD events by the ESD traps integrated in the hybrid metal antenna design.

Figure 5:
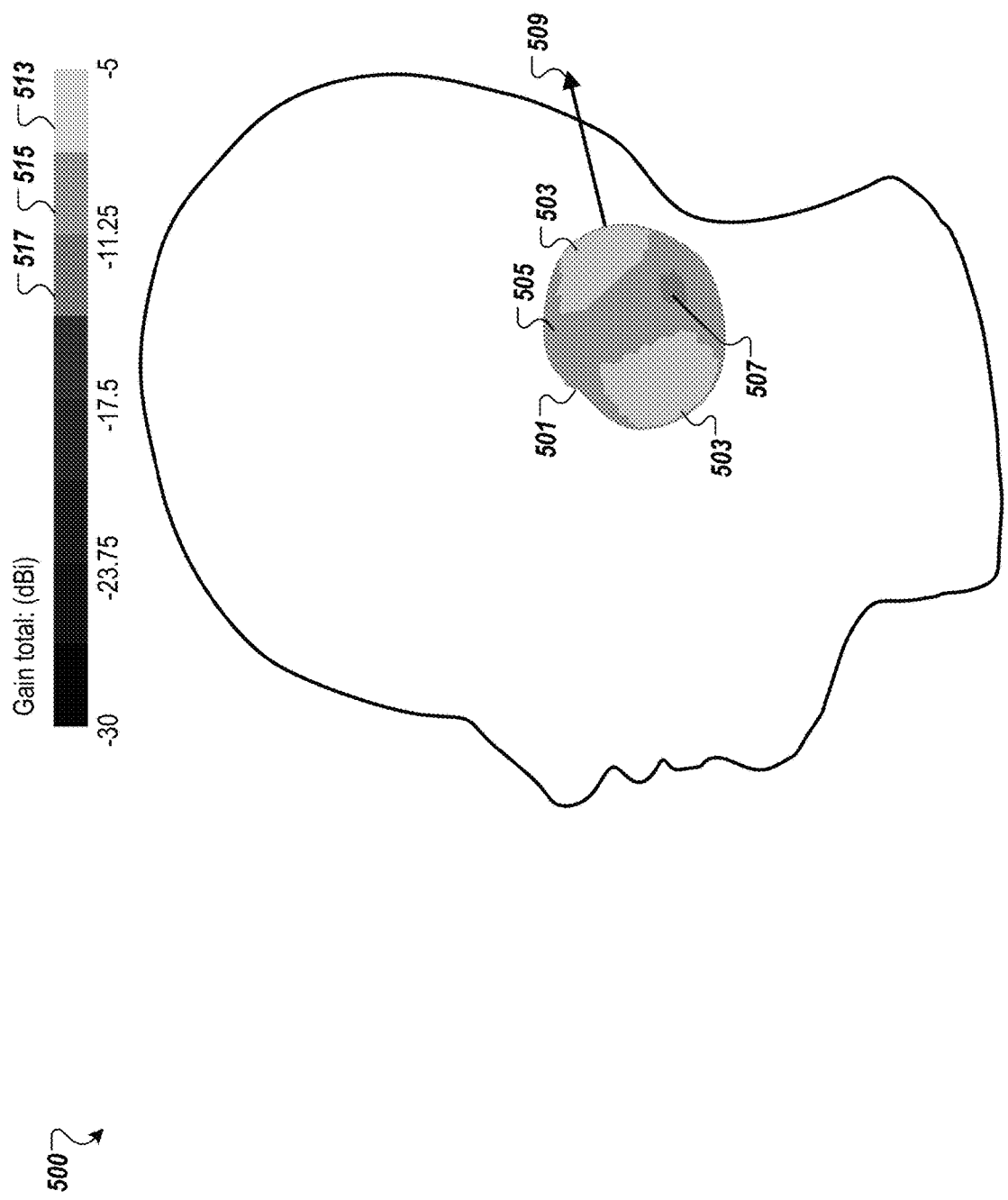
FIG. 5 is a schematic drawing of a radiation pattern of a wireless earbud of FIG. 1A in a user's ear according to one embodiment.

A radiation exposure of the user due to the radiation of the radiating element of the hybrid metal element may be approximately 1.4 dB lower than a radiation exposure from a wireless earbud with discrete antenna and touch elements, as described in further detail in reference to FIG. 5 and FIG. 6.

Although the description herein relates to a wireless earbud, other electronic devices may be used in connection with the embodiments of the present application. In this regard, the embodiments of the present application may be used in connection with any suitable computing device including an antenna and touch sensing. In addition to the wireless earbuds described in detail herein, other electronic devices may be employed, such as, for example, a cellular phone, a tablet, a wireless speaker, etc.

The electronic device may connect to a source via a suitable communications protocol to obtain a radio signal from a source (e.g., a mobile phone, a television, a computing device, etc.) for playback via a speaker system of the electronic device. Several topologies of antenna structures are contemplated herein. The antenna structures described herein can be used for WAN technologies, such as cellular technologies including LTE frequency bands, third generation (3G) frequency bands, Wi-Fi® and Bluetooth® frequency bands or other WLAN frequency bands, PAN frequency bands, and so forth.

Figure 2:
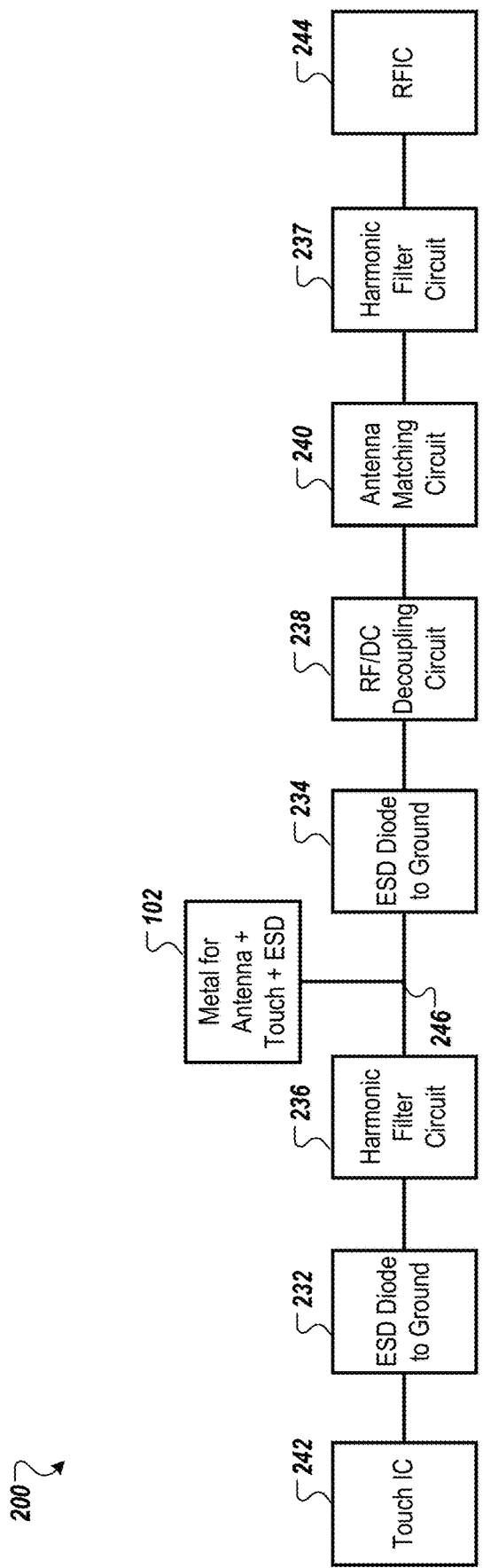
FIG. 2 is a block diagram of a wireless earbud with metal element according to one embodiment.

FIG. 2 is a block diagram of a wireless earbud 200 with metal element 102 according to one embodiment. In one embodiment, the metal element 102 is a hybrid metal element that includes at least a radiating element, an electrode for touch sensing, and two ESD traps. In another embodiment, the metal element 102 is a hybrid metal element that includes at least a radiating element, an electrode for touch sensing, and a different number of ESD traps (such as one, three, four, etc.). The metal element 102 is contained within a housing of the wireless earbud 200. In some embodiments, the metal element 102 is designed on a non-cosmetic surface of a top portion of the housing of the wireless earbud 200. The metal element 102 is coupled to a first harmonic filter circuit 236 at a first node 246. The first harmonic filter circuit 236 is coupled between touch circuitry 242 and the metal element 102. The first harmonic filter circuit 236 may be a passive harmonic filter, an active harmonic filter, or a hybrid harmonic filter to filter (e.g., remove) current harmonics (or voltage harmonics), which may be non-sinusoidal components of a current (or voltage) signal.

In some embodiments, a first ESD diode 232 can be coupled between the touch circuitry 242 and the first harmonic filter circuit 236. The first ESD diode 232 provides a low impedance path to a ground potential in order to protect ESD-sensitive components such as the touch circuitry 242, microphones, and other components of the wireless earbud 100.

A second ESD diode 234 is further coupled to the metal element 102 at the first node 246 to provide a low impedance path to the ground potential in order to protect ESD-sensitive components such as the microphones from ESD events. A radio frequency/direct current (RF/DC) decoupling circuit 238 (e.g., a DC open and RF short circuit) is coupled to the second ESD diode 234 to prevent DC signals from flowing in the system while allowing higher frequency signals, like RF signals, to flow. A DC signal can be a signal with a low frequency or negligibly low frequency. In some embodiments, the RF/DC decoupling circuit 238 may be a capacitor with a capacitance of approximately 10 pico-Farad (pF), as shown in more detail in FIGS. 3A-3D. In other embodiments, the RF/DC decoupling circuit 238 may include one or more capacitors and other components. In some embodiments, the RF/DC decoupling circuit 238 may include a decoupling capacitor, a bypass capacitor, or the like. In other embodiments, the RF/DC decoupling circuit 238 may include more than one decoupling capacitors. In one embodiment, the RF/DC decoupling circuit may allow signals with frequencies between 2400 MHz-2485 MHz and may block signals with frequencies between 200 kHz-400 kHz.

An antenna matching circuit 240 is coupled between a second harmonic filter circuit 237 and the RF/DC decoupling circuit 238. The second harmonic filter circuit 237 is the same or similar as the first harmonic filter circuit 236. The antenna matching circuit 240 matches an input impedance of the metal element 102 operating as an antenna to an output impedance of a radio (such as the radio of FIG. 1A). A RF integrated circuit (RFIC) 244 is coupled to the second harmonic filter circuit 237. In one embodiment the RFIC 244 is a Bluetooth® system on chip (SoC). Alternatively, the RFIC 244 can include other radio technologies, such as Wi-Fi®, Zigbee®, LTE, or the like. The RFIC 244 includes the radio, a transceiver, a receiver, and the like.

Figure 3A:
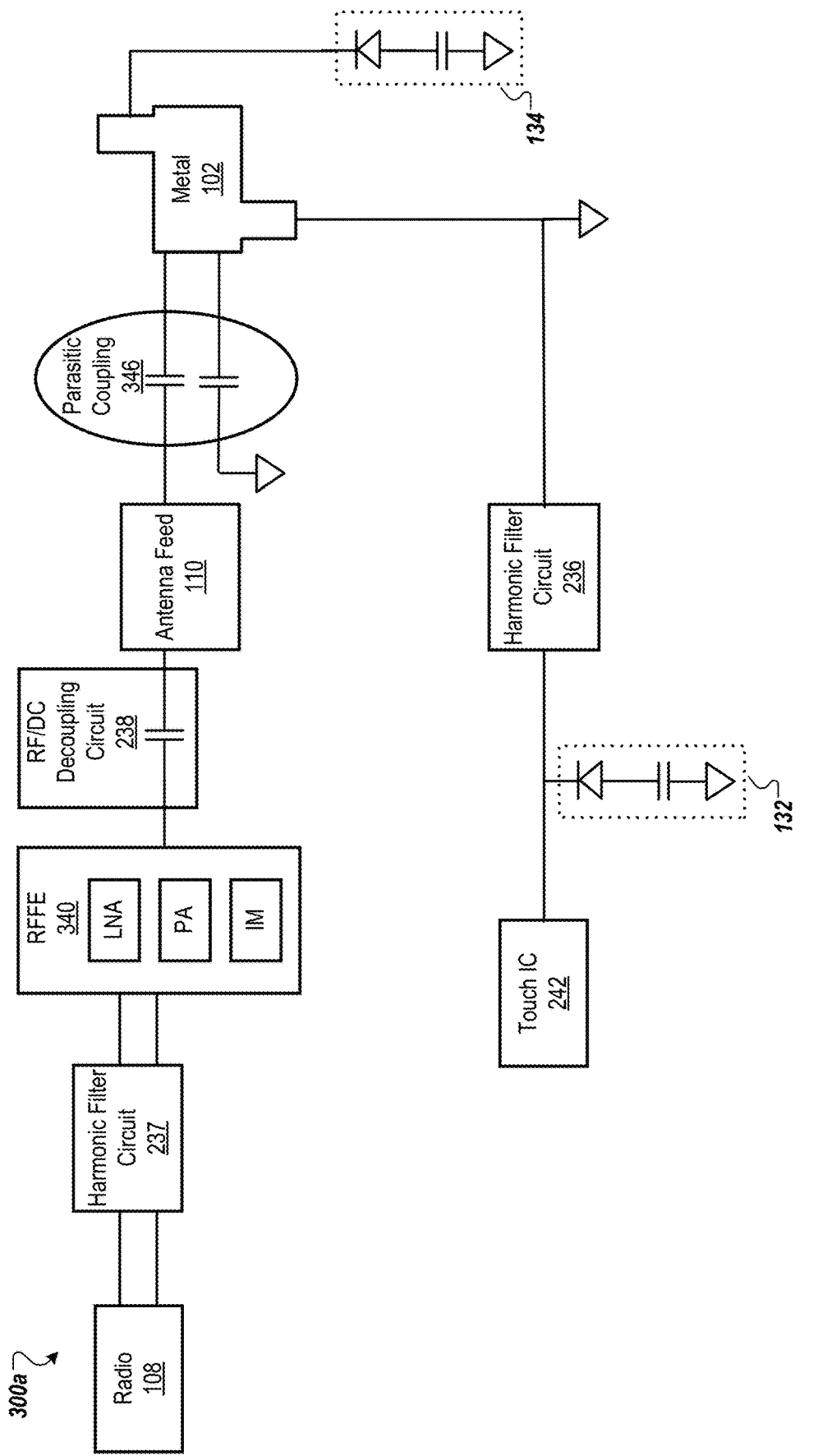
FIG. 3A is a schematic diagram of an equivalent circuit of a wireless earbud with a metal element according to one embodiment.

FIG. 3A is a schematic diagram of an equivalent circuit of a wireless earbud 300a with a metal element 102 according to one embodiment. In the depicted embodiment, the metal element 102 is a hybrid metal element including a radiating element, a touch element (or touch electrode), and two ESD traps. In other embodiments, the metal element may include a different number of ESD traps, such as one, three, four, or the like. The ESD traps are sections of the metal element 102 that are coupled to ESD diodes to effectively trap an ESD event and provide the shortest electrical path to ground. Although not every component is shown, the wireless earbud 300a is similar to the wireless earbud 100 of FIG. 1A and the wireless earbud 200 of FIG. 2, as noted by the same or similar reference numbers. A radio 108 is parasitically coupled to the metal element 102. A harmonic filter circuit 237 is coupled to the radio 108, and a RF front end (RFFE) 340 is coupled to the harmonic filter circuit 237. In some embodiments, the RFFE 340 may include a low noise amplifier (LNA), a power amplifier (PA), and an impedance matching (IM) circuit. In other embodiments, the RFFE 340 may include an LNA and a PA. An RF/DC decoupling circuit is coupled between the RFFE 340 and an antenna feed structure 110. In one embodiment, the antenna feed structure 110 is configured to apply an RF signal for the radio 108 via the RF/DC decoupling circuit 238. In another embodiment, the antenna feed structure 110 is configured to parasitically induce a surface current on the metal element 102 that causes the metal element 102 (or at least a portion of the metal element 102) to radiate electromagnetic energy. In some embodiments, the metal element radiates electromagnetic energy as a parasitic monopole element. In some embodiments, the metal element is a parasitically coupled monopole antenna. An effective length of the metal element corresponds to an operating frequency range of the radio, and the metal element radiates electromagnetic energy of the operating frequency range. In some embodiments, the RF/DC decoupling circuit 238 may be a capacitor, such as a decoupling capacitor or a bypass capacitor. In other embodiments, the RF/DC decoupling circuit 238 may include more than one capacitor. In one embodiment, the capacitor is a 10 pF capacitor. In one embodiment, the RF/DC decoupling circuit may allow signals with frequencies between 2400 MHz-2485 MHz and may block signals with frequencies between 200 kHz-400 kHz. The antenna feed structure 110 is coupled to the RF/DC decoupling circuit 238. The circuitry including the radio 108, the harmonic filter circuit 237, the RFFE 340, the RF/DC decoupling circuit 238, and the antenna feed structure 110 are parasitically coupled to the metal element 102. The parasitic coupling is represented by parasitic coupling 346.

A touch integrated circuit (IC) 242 is operatively coupled to the metal element 102. The metal element 102 is coupled to a first ESD element 132 and a second ESD element 134. The metal element 102 may be coupled to the first ESD element 132 and the second ESD element 134 via a first section (such as first section 116 of FIG. 1A) and a third section (such as third section 120 of FIG. 1A). A harmonic filter circuit 236 is coupled between the first ESD element 132 and the metal element 102. The first ESD element 132 is coupled between the harmonic filter circuit 236 and the touch IC 242.

Figure 3B:
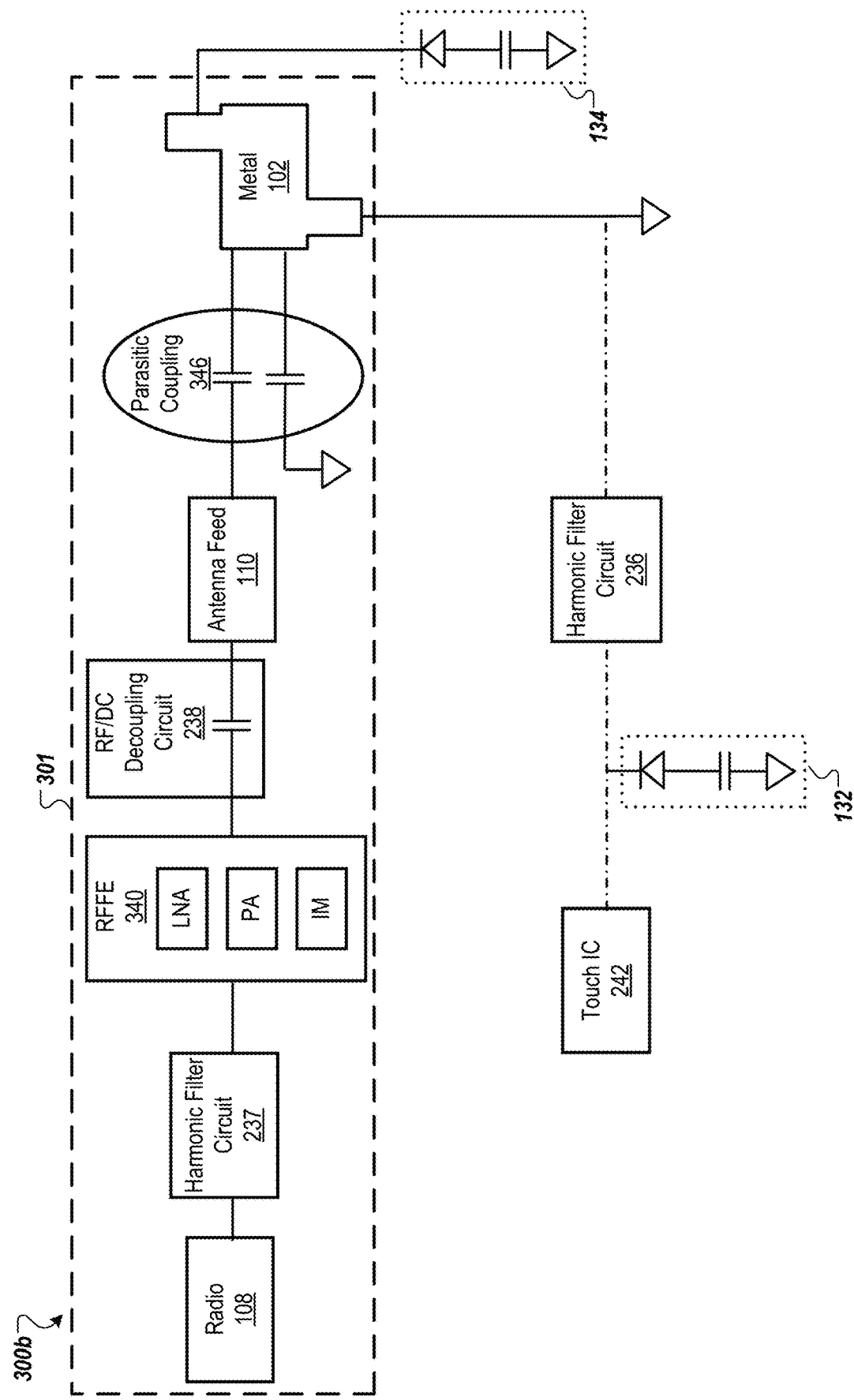
FIG. 3B is a schematic diagram of an equivalent circuit of a wireless earbud during radio communication according to one embodiment.

FIG. 3B is a schematic diagram of an equivalent circuit of a wireless earbud 300b during radio communication according to one embodiment. In one embodiment, the wireless earbud is configured to transmit/receive a signal wirelessly. In another embodiment, the wireless earbud is configured to wirelessly communicate with a different wireless device. In one embodiment, the signal includes an RF component, a DC component, and an ESD spike. In other embodiments, the signal includes any combination of the RF component, the DC component, and the ESD spike. In other embodiments, the signal includes an additional component in addition to the RF component, the DC component, and/or the ESD spike. The radio 108 may be configured to transmit/receive signals of different frequencies. In one embodiment, the radio 108 is a Bluetooth® radio configured to transmit/receive a 2.45 GHz signal. In another embodiment, the radio 108 may be a Wi-Fi radio configured to transmit/receive a 2.4 GHz signal or a 5 GHz signal. In other embodiments, the radio 108 may be configured to transmit/receive signals in frequency bands such as WAN frequency bands, PAN frequency bands, cellular frequency bands including Long Term Evolution (LTE) frequency bands, third generation (3G) frequency bands, fourth generation (4G) frequency bands, fifth generation (5G) frequency bands, or other wireless local area network (WLAN) frequency bands. The signal may contain an RF component and a DC component. The RF component of the signal can be referred to as the RF signal. When a signal is transmitted/received by the wireless earbud, the RF signal is maintained within radio circuitry 301. The radio is configured to apply the RF signal to the antenna feed structure 110 via the decoupling circuit 238. The antenna feed structure 110 is parasitically coupled to the metal element 102 and the antenna feed structure 110 is configured to parasitically induce a current (such as a surface current) on the metal element 102 that causes at least a portion of the metal element 102 to radiate electromagnetic energy (e.g., as a parasitic monopole element). The wireless earbud may include an audio component (e.g., such as a speaker) and may be configured to produce an audio output corresponding to a received RF signal. The RF/DC decoupling circuit is configured to pass the RF signal component from the signal, while not passing DC signals or signals that correspond to a conductive object being in proximity of the metal element 102.

Figure 3C:
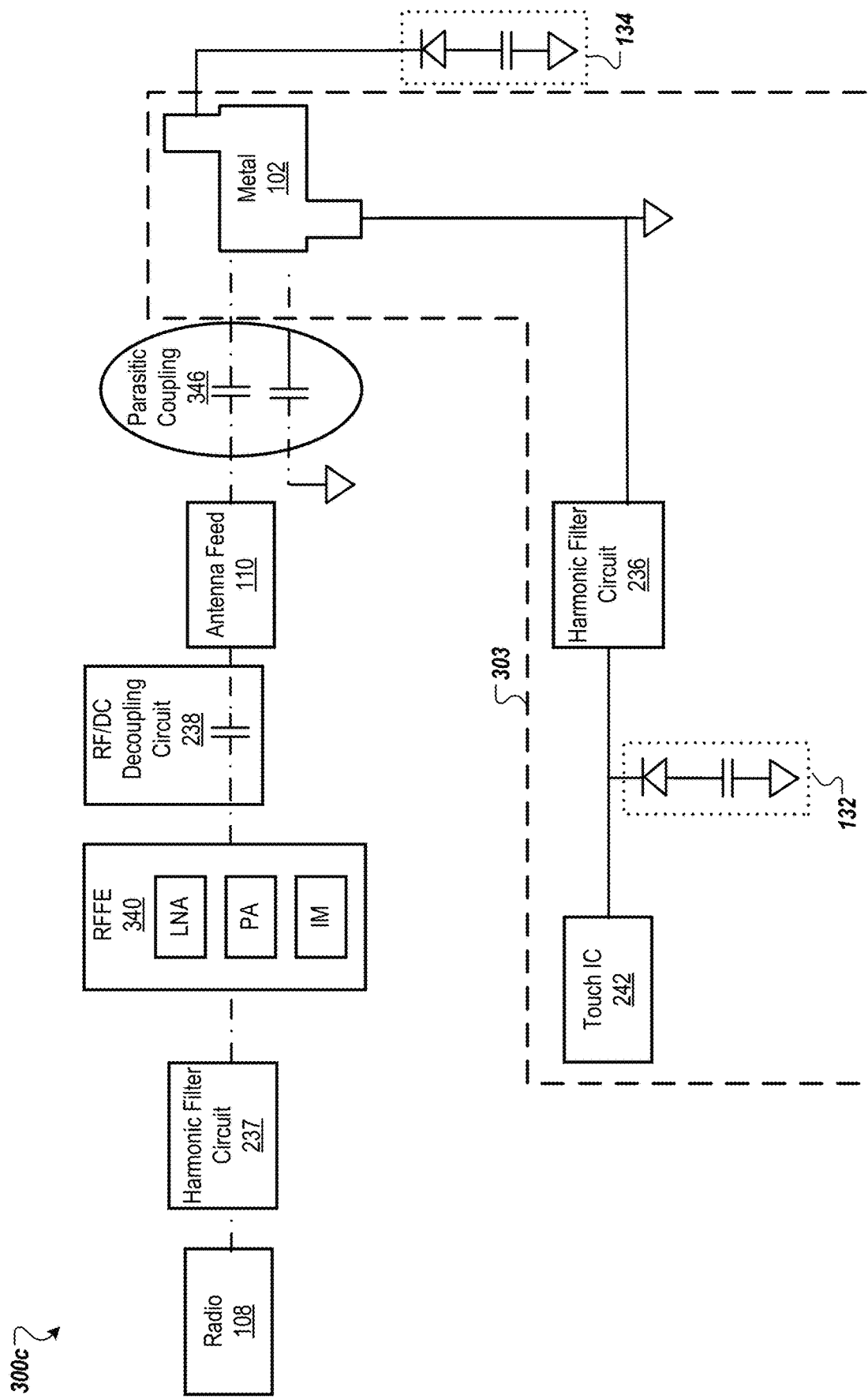
FIG. 3C is a schematic diagram of an equivalent circuit of a wireless earbud during a touch sensing operation according to one embodiment.

FIG. 3C is a schematic diagram of an equivalent circuit of a wireless earbud 300c during a touch sensing operation according to one embodiment. The earbud may receive a signal (e.g., as described in reference to FIG. 3B) which may contain an RF component for radio communications and a separate component for touch sensing. The separate component can correspond to signals in connection with a conductive object (e.g., a finger) in proximity to the metal element. When the signal is received by the wireless earbud, a DC component of the signal is maintained within touch circuitry 303. The touch IC 242 is configured to process the DC component of the signal in order to start/stop audio playback, to adjust volume, to turn on/off the wireless earbud, and the like. A harmonic filter circuit 236 is coupled between the touch IC 242 and the metal element 102. The harmonic filter circuit 236 is configured to remove harmonic, non-sinusoidal components of the DC signal. The harmonic filter circuit 236 may be a passive harmonic filter, an active harmonic filter, or a hybrid harmonic filter. In some embodiments, a first ESD element 132 is coupled between the touch IC 242 and the harmonic filter circuit 236. The ESD element 132 is further coupled to the metal element 102. In one embodiment, the first ESD element 132 is disposed near a microphone of the wireless earbud and is configured as a shortest electrical path to a ground potential in order to protect the microphone from an ESD event. The ESD event can be a short, a spike, a strike, or the like. In other embodiments, the first ESD element 132 is configured to provide a shortest path to the ground potential in order to protect a different ESD-sensitive component from the ESD event.

Figure 3D:
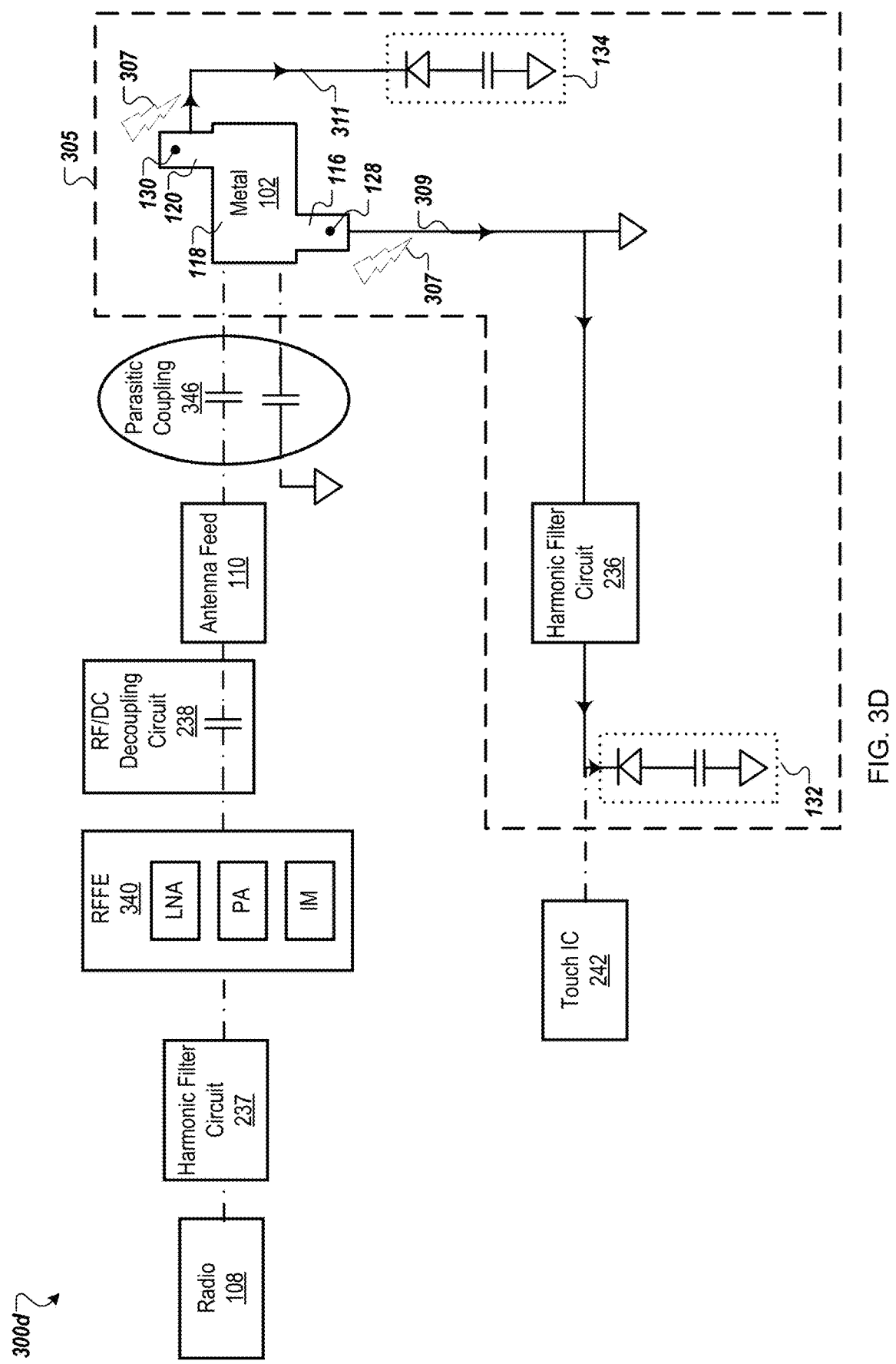
FIG. 3D is a schematic diagram of an equivalent circuit of a wireless earbud during an ESD event according to one embodiment.

FIG. 3D is a schematic diagram of an equivalent circuit of a wireless earbud 300d during an ESD event according to one embodiment. Though depicted schematically in FIG. 3D, the metal element 102 may be the same as the metal element 102 in FIG. 1A. ESD protection circuitry 305 is configured to protect ESD-sensitive components from an ESD event 307. In one embodiment, the metal element 102 includes a first section (such as the first section 116), a second section (such as the second section 118), and a third section (such as the third section 120) as described in reference to FIG. 1A. Each section of the metal element, other than the second section 118, may be an ESD trap associated with an ESD element. In one embodiment, the first section 116 is associated with the first ESD element 132 and the third section 120 is associated with the second ESD element 134. Though depicted with two ESD traps, in other embodiments the metal element may have additional sections (such as a fourth section, a fifth section, etc.) similar to the first section and the third section, associated with additional ESD elements (such as a third ESD element, a fourth ESD element, etc.) similar to the first ESD trap and the second ESD trap.

During an ESD event, various ESD components of the wireless earbud risk being damaged. In particular, the wireless earbud described herein (such as wireless earbud 100 of FIG. 1A) includes two microphones (the first microphone 112 and the second microphone 114, not shown in FIG. 3D). The first microphone 112 is disposed on a circuit board (such as circuit board 106 of FIG. 1A) beneath a first opening 128 (e.g., a cutout) in the first section 116. The second microphone 114 is disposed on the circuit board beneath a second opening 130 in the third section 120. The first section 116 is disposed in proximity to the first microphone 112 and is coupled to the first ESD element 132. The third section 120 is disposed in proximity to the second microphone 114 and is coupled to the second ESD element 134. The first ESD element 132 is configured to provide a first shortest electrical path 309 to a ground potential to route an ESD event away from the first microphone 112. The second ESD element 134 is configured to provide a second shortest electrical path 311 to the ground potential to route the ESD event away from the second microphone 114. The first opening 128 and the second opening 130 in the first section 116 and the third section 120 provide a minimally impeded audio path to the first microphone 112 and the second microphone 114, respectively. In other embodiments, however, the ESD-sensitive components (such as field effect transistors (FETs), ICs, laser diodes, and the like) may be other components that do not require an opening in the corresponding section.

Figure 4:
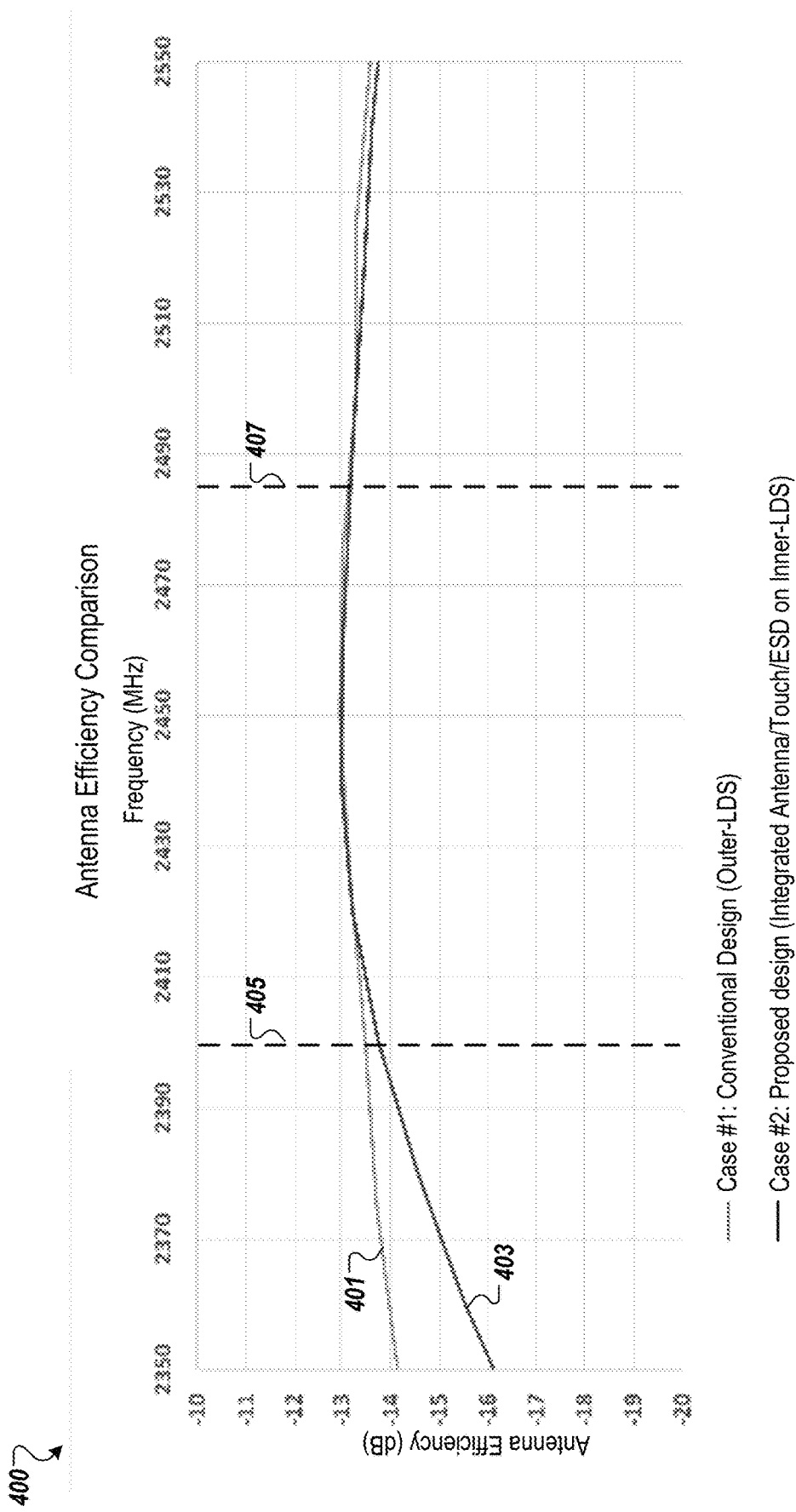
FIG. 4 is a graph of antenna efficiency of a wireless earbud with a hybrid metal element compared to antenna efficiency of a wireless earbud with discrete antenna and touch elements according to one embodiment.

FIG. 4 is a graph 400 of antenna efficiency of a wireless earbud with a hybrid metal element compared to antenna efficiency of a wireless earbud with discrete antenna and touch elements according to one embodiment. In one embodiment, a frequency range of the radio (e.g., the radio 108 of FIG. 1A) may be between 2400 MHz (denoted by dotted line 405) and 2485 MHz (denoted by dotted line 407). In this frequency range, the efficiency of the antenna (e.g., the radiating element of the metal element 102) may be between −12 dB to −14 dB as shown by curve 401. In the same frequency range, the efficiency of the antenna of the wireless earbud with discrete antenna and touch elements may also be between −12 dB and −14 dB as shown by curve 403. Therefore, the wireless earbud 100 with the metal element 102 combining the radiating element, the touch element, and the first ESD elements may be cheaper to manufacture, have a smaller form factor, while not compromising on antenna/wireless performance.

FIG. 5 is a schematic drawing 500 of a radiation pattern 501 of a wireless earbud 100 of FIG. 1A in a user's ear according to one embodiment. In the depicted embodiment, the wireless earbud is operating at a frequency of 2.45 GHz. In other embodiments, the wireless earbud may operate a different frequency, such as 5 GHz. The wireless earbud 100 may have an antenna architecture designed to have two radiation peaks 503 along a vector 509 as shown in FIG. 5. The vector 509 may be a vector that points along a direction of maximum radiation. The direction of the radiation peaks 503 may be the same as a direction of a radiation peak of a wireless earbud with discrete antenna and touch elements. In other words, a vector pointing along a direction of maximum radiation is the same for both the wireless earbud 100 and the wireless earbud with discrete antenna and touch elements. The radiation peaks 503 have a radiation gain of between approximately −8.125 (decibels-isotropic (dBi) and −5 dBi as shown by section 513 of a gain total color scale. A region 505 of the radiation pattern 501 has a radiation gain of between approximately −11.25 dBi and −8.125 dBi, as shown by section 515 of the gain total color scale. A region 507 of the radiation pattern 501 has a radiation gain of approximately −14.375 dBi to −11.25 dBi, as shown by section 517 of the gain total color scale. The radiation pattern results from a surface current distribution on a radiating portion of the metal element (such as metal element 102 of FIG. 1A) and on the circuit board (such as circuit board 106 of FIG. 1A) of the wireless earbud 100.

FIG. 6 is a table 600 of a comparison a wireless earbud with a hybrid metal element and a wireless earbud with discrete antenna and touch elements according to one embodiment. In the description of FIG. 6, the wireless earbud with a hybrid metal element may be referred to as a "proposed antenna design," and the wireless earbud with discrete antenna and touch elements may be referred to as a "conventional antenna design." The comparison of table 600 shows the power handling capability or specific absorption rate (SAR) performance of a wireless earbud with a hybrid metal element including a radiating element, touch element, and ESD traps and the power handling capability or SAR performance of a wireless earbud with discrete antenna and touch elements according to one embodiment. A SAR value corresponds to a relative amount of energy absorbed in a head of a user in proximity to a wireless device (such as a wireless earbud). The Federal Communications Commission (FCC) may limit the SAR from a wireless device wireless device to 1.6 milliwatts per gram (mW/g). Row 609 of table 600 indicates parameters for respective columns 603-607. Row 611 indicates parameter values corresponding to the conventional antenna design for the respective columns 603-607. Row 613 indicates parameter values corresponding to the proposed antenna design for the respective columns 603-607.

Column 603 indicates an input power for the wireless earbuds to attain a SAR of 1.6 mW/g. In the current embodiment, difference in the input power for the proposed antenna design (shown by the intersection of row 613 and column 603) and the input power for the conventional antenna design (shown by the intersection of row 611 and column 603) is 1.4 decibel-mW (dBm). The proposed antenna design can handle 1.4 dB higher input power than the conventional antenna design for an equivalent antenna efficiency (e.g., see FIG. 4). This may lead to the radiation exposure to the user to being 1.4 dB lower with an equivalent input power. Equivalently, this may lead to the proposed antenna design having a higher power handling capability by 1.4 dB before violating the FCC SAR requirements. The improved performance of the proposed antenna design may be attributed to a well-distributed surface current density on a ground plane (e.g., of the circuit board 106 of FIG. 1A) due to the proposed antenna design being grounded, which can avoid current hotspots. The resulting in-ear radiation pattern is shown by FIG. 5.

The intersection of row 613 and column 605 indicates an in-ear total radiated power (TRP) for the proposed antenna design when the SAR is 1.6 mW/g. The intersection of row 611 and column 605 indicates the TRP for the conventional antenna design when the SAR is 1.6 mW/g. A difference 1.3 dBm in the TRP between the proposed antenna design and the conventional antenna design indicates that the proposed antenna design has a higher in-ear power capability.

The intersection of row 613 and column 607 indicates an in-ear effective isotropic radiated power (EIRP) for the proposed antenna design when the SAR is 1.6 mW/g. The intersection of row 611 and column 605 indicates the EIRP for the conventional antenna design when the SAR is 1.6 mW/g. A difference 1.5 dBm in the EIRP between the proposed antenna design and the conventional antenna design indicates that the proposed antenna design has a higher isotropic power capability.

Figure 7A:
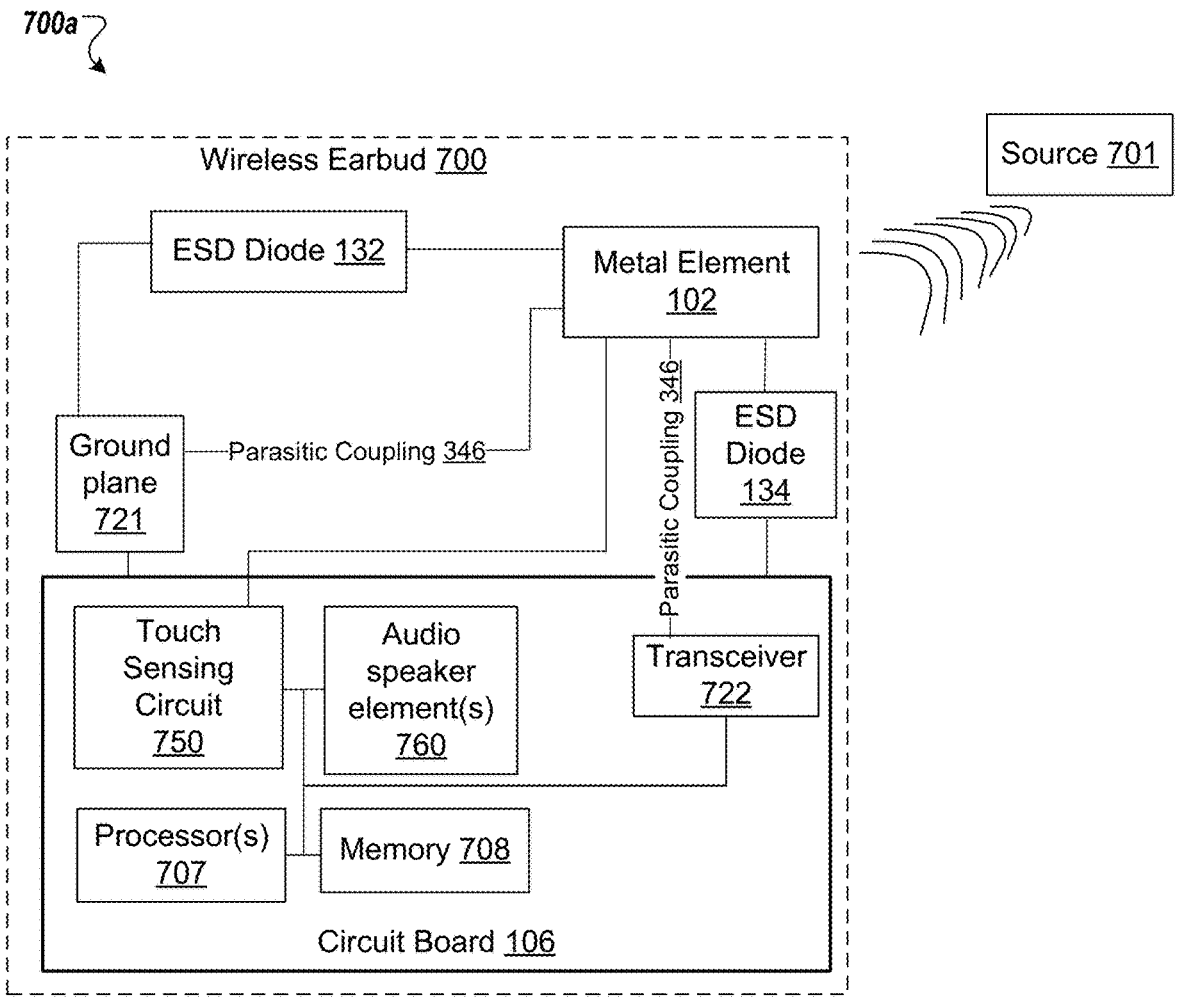
FIG. 7A is a diagram showing various components of a wireless earbud, according to one embodiment.

FIG. 7A is a diagram 700*a* showing various components of a wireless earbud 700, according to one embodiment. The wireless earbud 700 can include a circuit board 106 including one or more components configured to enable the wireless earbud functionality. In one embodiment, a touch sensing circuit 750, one or more audio speaker elements 760, a processing device 707, a transceiver 722, and a memory 708 are disposed on the circuit board 106. The wireless earbud 700 may include a metal element 102. The metal element 102 may be a hybrid metal element including a radiating element, a touch element, and ESD traps.

In one embodiment, the touch sensing circuit 750 may be coupled to the metal element 102 (or a portion of the metal element 102 which acts as a touch electrode or touch sensing element). In one embodiment, one or more sensor lines may be connected to one or more touch electrodes or sensors and supply an electrical charge in the touch sensors of the to the touch sensing circuit 750. In one embodiment, the touch sensing circuit 750 detects a touch or proximity of a conductive element (e.g., a finger) and processes the signal. In one embodiment, when a conductive object (e.g., a finger, hand, or other object) comes into contact or close proximity with the metal element 102, the capacitance changes and the conductive object is detected. The capacitance change of the metal element 102 can be measured by the touch sensing circuit 750. In one embodiment, the touch sensing circuit 150 may process the signal from the metal element 102 to control operation of the one or more audio speaker elements 760 of the wireless earbud 700. In one embodiment, the touch sensing circuit 750 converts the measured capacitances of the capacitive sense elements into digital values for processing by the processing device 707. The processing device 707 can be one or more processor(s) 707 may include one or more CPUs, microcontrollers, field programmable gate arrays (FPGAs), or other types of processors. The wireless earbud 700 may also include system memory 708, which may correspond to any combination of volatile and/or non-volatile storage mechanisms. The system memory 708 stores instructions for the execution of the wireless earbud functionality using the processor(s) 707, such as the operation of the wireless earbud to control the audio speaker element(s) 760 based on signals received via the touch sensing circuit 750 and the metal element 102.

In one embodiment, at least a portion of the metal element 102 is configured to receive a wireless signal from a source device 701. The source device 701 may be any suitable transmitter of a wireless signal, including, for example, a mobile device, a television, a computer, etc. In one embodiment, metal element 102 is electrically coupled to a ground plane 721. In one embodiment, an RF feed is parasitically coupled (e.g., parasitic coupling 346) to a transceiver 722 disposed on the circuit board 106. In one embodiment, the transceiver 722 measures the RF signal of the metal element 102 and generates a corresponding digital signal. In one embodiment, the transceiver 722 outputs the digital signal to the one or more processor(s) 707 for the production of a corresponding audio signal. In one embodiment, the processor(s) 707 may transmit the audio signal to the audio speaker elements 760 to produce an audio output corresponding to the RF signal received by the metal element 102.

Although FIG. 7A relates to a wireless earbud 700, embodiments of the present application may be implemented in any type of computing device, such as an electronic book reader, a PDA, a mobile phone, a laptop computer, a portable media player, a tablet computer, a camera, a video camera, a netbook, a desktop computer, a gaming console, a DVD player, a Blu-ray®, a computing pad, a media center, a voice-based personal data assistant, and the like. Alternatively, the application can be implemented in any other device used in a WLAN network (e.g., Wi-Fi® network), a WAN network, a cellular network, a Bluetooth network, or the like.

The metal element 102 can receive different frequency bands, such as WAN frequency bands, cellular frequency bands including Long Term Evolution (LTE) frequency bands, third generation (3G) frequency bands, fourth generation (4G) frequency bands, Wi-Fi® frequency bands, Bluetooth® frequency bands, or other wireless local area network (WLAN) frequency bands. It should be noted that the Wi-Fi® technology is the industry name for wireless local area network communication technology related to the IEEE 802.11 family of wireless networking standards by Wi-Fi Alliance. The wireless earbud 100 may include RF modules and/or other communication modules, such as a WLAN module, a Global Positioning System (GPS) receiver, a near field communication (NFC) module, an amplitude modulation (AM) radio receiver, a frequency modulation (FM) radio receiver, a PAN module (e.g., Bluetooth® module, Zigbee® module), a GNSS receiver, and so forth.

Figure 7B:
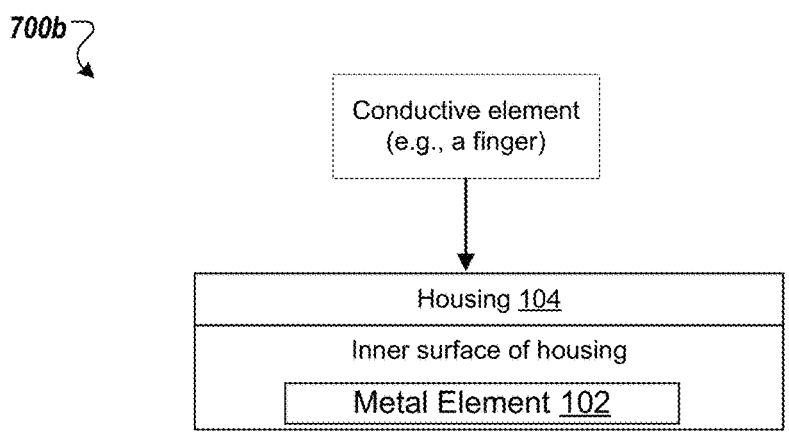
FIG. 7B is a diagram showing the arrangement of a metal element disposed within a housing of a wireless earbud according to one embodiment.

FIG. 7B is a diagram 700b showing the arrangement of a metal element 102 disposed within a housing of a wireless earbud 700 according to one embodiment. The metal element 102 is disposed on an inner surface of the housing 104 of the wireless earbud. Since the metal element 102 is disposed within the housing, a form factor of the wireless earbud 700 may be reduced compared to a wireless earbud with discrete antenna elements and touch elements, in which the touch element is disposed on an outer surface of the housing. Additionally, in such a case, an extra manufacturing step of painting is required to mask the pattern on the cosmetic surface of the housing. By removing the extra manufacturing step of painting, a BoM cost to manufacture the wireless earbud 700 is reduced.

Figure 8:
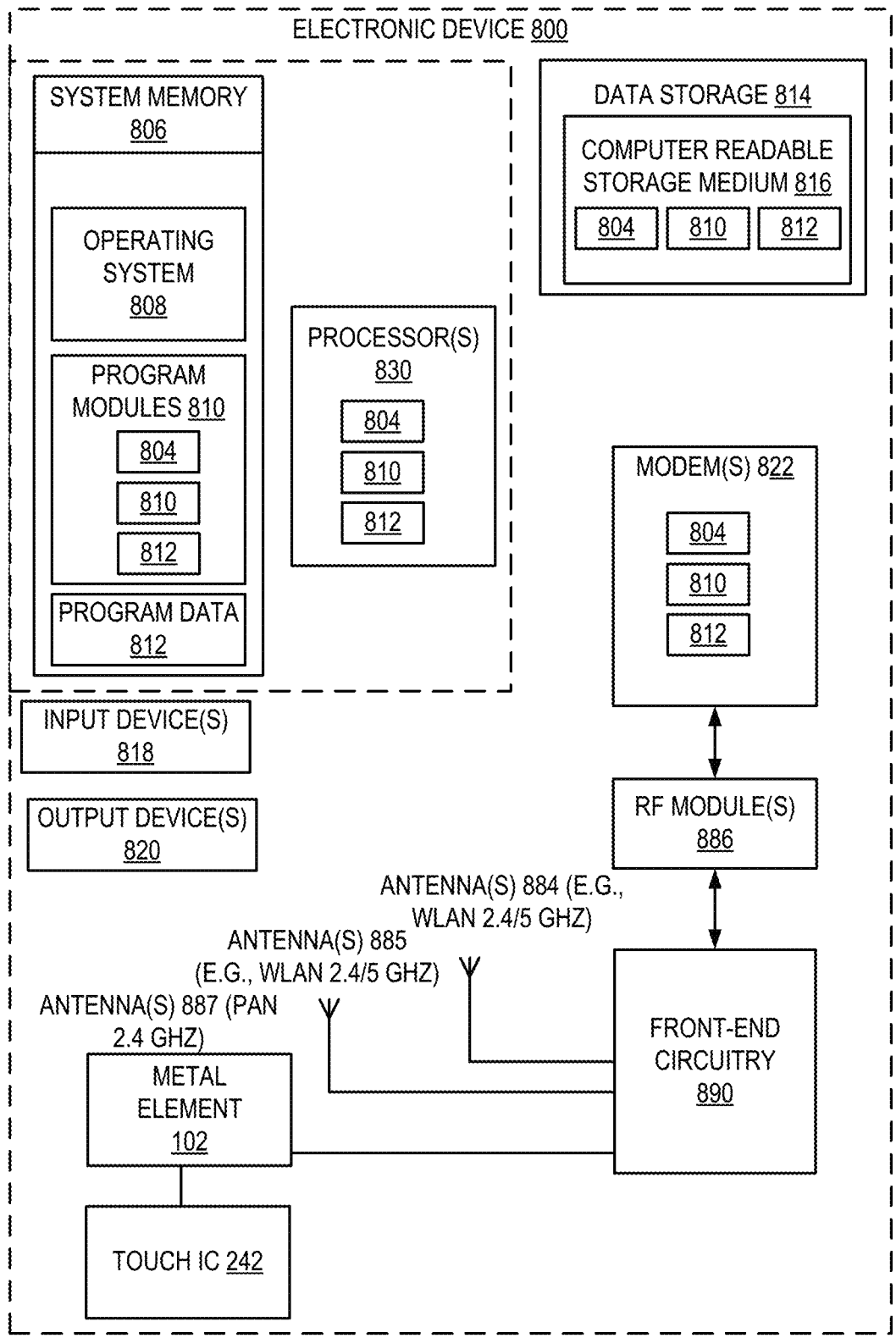
FIG. 8 is a block diagram of an electronic device that includes a metal element serving as a radiating element, touch element, and ESD elements as described herein according to one embodiment.

FIG. 8 is a block diagram of an electronic device 800 that includes a metal element 102 serving as a radiating element, touch element, and ESD elements as described herein according to one embodiment. The electronic device 800 may correspond to the wireless earbuds described above with respect to FIGS. 1-7. In one embodiment, the electronic device 800 is the wireless earbud 100 of FIG. 1. In another embodiment, the electronic device 800 is the wireless earbud 100 of FIG. 2. In another embodiment, the electronic device 800 is the wireless earbud 100 of FIGS. 3A-3D. In another embodiment, the electronic device 800 is the wireless earbud 100 of FIG. 7A. Alternatively, the electronic device 800 may be other electronic devices, as described herein.

The electronic device 800 includes one or more processor(s) 830, such as one or more CPUs, microcontrollers, field programmable gate arrays, or other types of processors. The electronic device 800 also includes system memory 806, which may correspond to any combination of volatile and/or non-volatile storage mechanisms. The system memory 806 stores information that provides operating system component 808, various program modules 810, program data 812, and/or other components. In one embodiment, the system memory 806 stores instructions of methods to control operation of the electronic device 800. The electronic device 800 performs functions by using the processor(s) 830 to execute instructions provided by the system memory 806. In one embodiment, the program modules 810 may include power adjustment categorization and decision logic that may perform some or all of the operations described herein, or any processes described herein. The program modules 810 may also include the baseband logic that performs similar operations as the baseband circuitry described herein.

The electronic device 800 also includes a data storage device 814 that may be composed of one or more types of removable storage and/or one or more types of non-removable storage. The data storage device 814 includes a computer-readable storage medium 816 on which is stored one or more sets of instructions embodying any of the methodologies or functions described herein. Instructions for the program modules 810 may reside, completely or at least partially, within the computer-readable storage medium 816, system memory 806 and/or within the processor(s) 830 during execution thereof by the electronic device 800, the system memory 806, and the processor(s) 830 also constituting computer-readable media. The electronic device 800 may also include one or more input devices 818 (keyboard, mouse device, specialized selection keys, touch input etc.) and one or more output devices 820 (displays, printers, audio output mechanisms, etc.).

The electronic device 800 further includes a modem 822 to allow the electronic device 800 to communicate via a wireless connections (e.g., such as provided by the wireless communication system) with other computing devices, such as remote computers, an item providing system, and so forth. The modem 822 can be connected to one or more radio frequency (RF) modules 886. The RF modules 886 may be a WLAN module, a WAN module, wireless personal area network (WPAN) module, Global Positioning System (GPS) module, or the like. The antenna structures (antenna(s) 884, 885, 887) are coupled to the front-end circuitry 890, which is coupled to the modem 822. The front-end circuitry 890 may include radio front-end circuitry, antenna switching circuitry, impedance matching circuitry, or the like. The antennas 884 may be GPS antennas, Near-Field Communication (NFC) antennas, other WAN antennas, WLAN or PAN antennas, or the like. The modem 822 allows the electronic device 800 to handle both voice and non-voice communications (such as communications for text messages, multimedia messages, media downloads, web browsing, etc.) with a wireless communication system. The modem 822 may provide network connectivity using any type of mobile network technology including, for example, Cellular Digital Packet Data (CDPD), General Packet Radio Service (GPRS), EDGE, Universal Mobile Telecommunications System (UMTS), Single-Carrier Radio Transmission Technology (1xRTT), Evaluation Data Optimized (EVDO), High-Speed Down-Link Packet Access (HSDPA), Wi-Fi®, Long Term Evolution (LTE) and LTE Advanced (sometimes generally referred to as 4G), etc.

The modem 822 may generate signals and send these signals to antenna(s) 884 of a first type (e.g., WLAN 5 GHz), antenna(s) 885 of a second type (e.g., WLAN 2.4 GHz), and/or antenna(s) 887 of a third type (e.g., WAN), via front-end circuitry 890, and RF module(s) 886 as descried herein. Antennas 884, 885, 887 may be configured to transmit in different frequency bands and/or using different wireless communication protocols. The antennas 884, 885, 887 may be directional, omnidirectional, or non-directional antennas. In addition to sending data, antennas 884, 885, 887 may also receive data, which is sent to appropriate RF modules connected to the antennas. One of the antennas 884, 885, 887 may be any combination of the antenna structures described herein. In one embodiment, the antenna 887 is the metal element 102 described herein. The metal element 102 is coupled to the touch IC 242 as described herein.

In one embodiment, the electronic device 800 establishes a first connection using a first wireless communication protocol, and a second connection using a different wireless communication protocol. The first wireless connection and second wireless connection may be active concurrently, for example, if an electronic device is receiving a media item from another electronic device via the first connection) and transferring a file to another electronic device (e.g., via the second connection) at the same time. Alternatively, the two connections may be active concurrently during wireless communications with multiple devices. In one embodiment, the first wireless connection is associated with a first resonant mode of an antenna structure that operates at a first frequency band and the second wireless connection is associated with a second resonant mode of the antenna structure that operates at a second frequency band. In another embodiment, the first wireless connection is associated with a first antenna structure and the second wireless connection is associated with a second antenna.

Though a modem 822 is shown to control transmission and reception via antenna (884, 885, 887), the electronic device 800 may alternatively include multiple modems, each of which is configured to transmit/receive data via a different antenna and/or wireless transmission protocol.

In the above description, numerous details are set forth. It will be apparent, however, to one of ordinary skill in the art having the benefit of this disclosure, that embodiments may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to convey the substance of their work most effectively to others skilled in the art. An algorithm is used herein, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "inducing," "parasitically inducing," "radiating," "detecting," "determining," "generating," "communicating," "receiving," "causing" or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

Embodiments also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but not limited to, any type of disk including floppy disks, optical disks, Read-Only Memories (ROMs), compact disc ROMs (CD-ROMs) and magnetic-optical disks, Random Access Memories (RAMs), EPROMs, EEPROMs, magnetic or optical cards, or any type of media suitable for storing electronic instructions.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the present embodiments as described herein. It should also be noted that the terms "when" or the phrase "in response to," as used herein, should be understood to indicate that there may be intervening time, intervening events, or both before the identified operation is performed.

It is to be understood that the above description is intended to be illustrative, and not restrictive. Many other embodiments will be apparent to those of skill in the art upon reading and understanding the above description. The scope of the present embodiments should, therefore, be determined with reference to the appended claims, along with the full scope of equivalents to which such claims are entitled.

What is claimed is:

1. A wireless earbud device comprising:
   a housing;
   a printed circuit board (PCB) disposed within the housing;
   a first microphone disposed on the PCB;
   a second microphone disposed on the PCB;
   touch circuitry disposed on the PCB;
   a radio disposed on the PCB and coupled to a radio frequency (RF) feed; and
   a metal element disposed on an inside surface of the housing, the metal element comprising a first section having a first opening located above the first microphone, a second section having a second opening located above the second microphone, and a third section, wherein:
   the touch circuitry is operatively coupled to the metal element; and
   the radio is parasitically coupled to the metal element and is configured to cause the metal element to radiate electromagnetic energy as a parasitic monopole element;
   a first electrostatic discharge (ESD) element coupled to the first section, the first section being configured to operate as an ESD trap that protects the first microphone;
   a second ESD element coupled to the second section, the second section being configured to operate as an ESD trap that protects the second microphone; and
   an audio speaker component disposed on the PCB, the audio speaker component to produce an audio output.

2. The wireless earbud device of claim 1, wherein the first opening, the second opening, and a center point of the metal element are located on a same axis, the center point being located between the first opening and the second opening.

3. An apparatus comprising:
   a metal element;
   touch circuitry coupled to the metal element;
   a radio;
   an antenna feed;
   a first circuit coupled between the radio and the antenna feed, wherein the radio is configured to apply a radio frequency (RF) signal to the antenna feed via the first circuit, and wherein the antenna feed is configured to parasitically induce a current on the metal element that causes at least a portion of the metal element to radiate electromagnetic energy; and
   a first electrostatic discharge (ESD) element coupled to the metal element, the first ESD element to provide an electrical path from the metal element to ground.

4. The apparatus of claim 3, wherein the metal element comprises a circular element with a section that is located between a first slit in the circular element and a second slit in the circular element, the second slit being parallel to the first slit, the first slit extending inward from a perimeter of the circular element in a first direction and the second slit extending inward from the perimeter of the circular element in a second direction opposite the first direction.

5. The apparatus of claim 3, further comprising an outer housing, wherein the metal element is disposed within the outer housing.

6. The apparatus of claim 3, wherein an effective length of the metal element corresponds to an operating frequency range of the radio.

7. The apparatus of claim 3, wherein the metal element is a parasitically coupled monopole antenna.

8. The apparatus of claim 3, further comprising:
a circuit board; and
a first microphone disposed on the circuit board, wherein the metal element comprises a first section that has a first cutout located above the first microphone, wherein the touch circuitry and the radio are disposed on the circuit board, wherein the first section and the first ESD element are configured to direct current away from the first microphone.

9. The apparatus of claim 8, further comprising:
a second microphone disposed on the circuit board, wherein the metal element further comprises a third section having a second cutout located above the second microphone; and
a second ESD element coupled to the third section, wherein the third section and the second ESD element are configured to direct the current away from the second microphone.

10. The apparatus of claim 3, wherein the metal element comprises a first section, a second section, and a circular element, and a center point of the circular element, the center point being located between the first section and the second section.

11. The apparatus of claim 3, the metal element is configured to radiate electromagnetic energy with an efficiency between −12 decibels (dB) and −14 dB within an operating frequency range of the radio.

12. A wireless device comprising:
a circuit board;
an electrical component disposed on the circuit board;
touch circuitry disposed on the circuit board;
a radio disposed on the circuit board and coupled to a radio frequency (RF) feed;
a metal element, the metal element comprising i) a first section, which is disposed in proximity to the electrical component, and ii) a circular element, and wherein:
the touch circuitry is operatively coupled to the metal element and is configured to detect a presence of a conductive object in proximity to the metal element; and
the radio is parasitically coupled to the metal element and is configured to wirelessly communicate data with a second wireless device; and
a first electrostatic discharge (ESD) element coupled to the first section and to a ground plane of the circuit board, wherein the first ESD element is configured to provide a first electrical short to the ground plane away from the electrical component.

13. The wireless device of claim 12, wherein the circular element comprises a section located between a first slit and a second slit that create a meandering conductive path between a distal end of the metal element and a proximal end of the metal element, the proximal end being closer to a connection point of the touch circuitry, wherein the metal element has an effective length corresponding to an operating frequency range of the radio.

14. The wireless device of claim 12, wherein to wirelessly communicate data with the second wireless device, the radio is configured to cause the metal element to radiate electromagnetic energy as a parasitic monopole element.

15. The wireless device of claim 12, further comprising:
a second electrical component disposed on the circuit board;
a third section which is disposed in proximity to the second electrical component; and
a second ESD element coupled to the third section and to the ground plane, wherein the second ESD element is configured to provide a second electrical short to the ground plane away from the second electrical component.

16. The wireless device of claim 15, wherein a first center point of the first section, a second center point of the circular element, and a third center point of the third section are located on a same axis, the second center point being located between the first center point and the third center point.

17. The wireless device of claim 15, wherein the electrical component and the second electrical component are microphones, and wherein:
the first section have a first opening located above the electrical component; and
the third section having a second opening located above the second electrical component.

18. The wireless device of claim 12, further comprising a first circuit coupled between the radio and the RF feed, wherein the radio is configured to apply an RF signal to the RF feed via the first circuit, and wherein the RF feed is configured to parasitically induce a surface current on the metal element that causes at least a portion of the metal element to radiate electromagnetic energy.

19. The wireless device of claim 12, further comprising:
an antenna feed;
a first circuit coupled between the radio and the antenna feed, wherein the radio is configured to apply a radio frequency (RF) signal to the antenna feed via the first circuit, and wherein the antenna feed is configured to parasitically induce a current on the metal element that causes at least a portion of the metal element to radiate electromagnetic energy; and
an audio output device to play audio responsive to the data.

20. The wireless device of claim 12, wherein the metal element is a parasitically coupled monopole antenna that radiates electromagnetic energy with an efficiency between −12 decibels (dB) and −14 dB within a frequency range of the radio.

* * * * *